US006799290B1

(12) United States Patent
Kirihata et al.

(10) Patent No.: US 6,799,290 B1
(45) Date of Patent: Sep. 28, 2004

(54) DATA PATH CALIBRATION AND TESTING MODE USING A DATA BUS FOR SEMICONDUCTOR MEMORIES

(75) Inventors: Toshiaki Kirihata, Poughkeepsie, NY (US); Gerhard Mueller, Meitingen (DE); David Russell Hanson, Brewster, NY (US)

(73) Assignee: Infineon Technologies North America Corp, San Jose, CA (US)

( * ) Notice: Subject to any disclaimer, the term of this patent is extended or adjusted under 35 U.S.C. 154(b) by 0 days.

(21) Appl. No.: 09/512,756

(22) Filed: Feb. 25, 2000

(51) Int. Cl.[7] .............................................. G11C 29/00
(52) U.S. Cl. ...................................................... 714/719
(58) Field of Search .............................. 714/718, 719; 365/189.05, 201

(56) References Cited

U.S. PATENT DOCUMENTS

| | | | |
|---|---|---|---|
| 4,096,565 A | 6/1978 | Ruckdeschel et al. | 710/3 |
| 4,635,190 A | 1/1987 | Meyer et al. | 365/200 |
| 5,561,765 A | 10/1996 | Shaffer et al. | 714/42 |
| 5,600,660 A | 2/1997 | Wolf | 714/715 |
| 5,745,430 A | 4/1998 | Wong et al. | 365/233 |
| 5,784,705 A | 7/1998 | Leung | 711/169 |
| 5,828,608 A | 10/1998 | Nguyen et al. | 365/189.05 |
| 5,959,911 A | 9/1999 | Krause et al. | 365/201 |
| 5,986,944 A | 11/1999 | Merritt | 365/189.05 |
| 6,081,479 A | 6/2000 | Ji et al. | 365/233 |
| 6,453,433 B1 * | 9/2002 | Vollarath | 714/718 |

OTHER PUBLICATIONS

Jamoussi et al., "Controllability and Observability Measures for Functional–Level Testability Evaluation", IEEE, 1993, pp. 154–157.
Kirihata et al., "A 390–mm$^2$, 16–Bank, 1–Gb DDR SRAM with Hybrid Bitline Architecture", D–State Circuits, vol. 34, No. 11, Nov. 1999.
EPO Search Report.

* cited by examiner

*Primary Examiner*—Albert Decady
*Assistant Examiner*—Shelly A Chase

(57) ABSTRACT

A method for testing a data path for a semiconductor memory device, in accordance with the present invention, includes providing a semiconductor memory device including a plurality of stages in a data path, and transferring data into the data path. Components are disabled to isolate at least one stage of the plurality of stages such that data written to or read from the at least one stage is available at an output. The data at the output is preferably compared to expected data. Alternately, system level calibration between devices may be performed to ensure proper communication between devices without destroying data in a memory array and making a dynamic data skew calibration possibly while running an application.

40 Claims, 7 Drawing Sheets

DATA PATH CALIBRATION AND TESTING MODE USING A DATA BUS FOR SEMICONDUCTOR MEMORIES

BACKGROUND

1. Technical Field

This disclosure relates to semiconductor testing and more particularly, to diagnostic test modes for testing data paths in isolation of a memory array.

2. Description of the Related Art

The evolution of sub-micron CMOS technology has steadily improved microprocessor speed. Quadrupling every three years, it has realized product chips with clock frequencies over 500 MHz and even an experimental chip with a 1 GHz clock frequency. It is highly desirable to have Dynamic Random Access Memories (DRAMs) not only with high density, but also with high bandwidth to narrow the bandwidth gap between microprocessors and DRAMs.

In general, high bandwidth DRAMs can be realized by pipelining a data path, for example, wave-pipelines or clocked-pipelines. Higher bandwidth can also be achieved by prefetching 2 or 4 bits per output data line. Pipelined prefetch architecture may be employed for DDR synchronous DRAMs, SinkLink DRAMS (SLDRAMs), and Rambus DRAMs (RDRAMs) with 200 MHz or beyond. This pipelined prefetch architecture, does however, require an accurate data path control for each pipeline stage and prefetch stage to make it work successfully, at the device level. Furthermore, as frequency increases, the communication between the memory device and a memory controller also requires more accurate data control at the system level. It is important to be able to verify the pipelined prefetch data path at the device level, and the memory's communication path with other devices while isolating the memory array.

Therefore, a need exists for test modes for testing data paths for semiconductor memories. A further need exists for data path test modes, which test the data path in isolation of a memory array. A still further need exists for calibration of a high speed memory device with a memory controller to provide accurate data control. The above needs should advantageously be provided without destruction of data stored in the memory array and while making dynamic calibration possible while an application is running.

SUMMARY OF THE INVENTION

A method for testing a data path for a semiconductor memory device, in accordance with the present invention, includes providing a semiconductor memory device including a plurality of stages in a data path, and transferring data into the data path. Components are disabled to isolate at least one stage of the plurality of stages such that data written to or read from the at least one stage is available at an output. The data at the output is preferably compared to expected data to confirm functionality.

A method for calibrating a data path for a memory device to provide communications between devices, in accordance with the present invention includes providing a semiconductor memory device including a plurality of stages in a data path and providing a memory controller for controlling memory operations of the memory device. Data is transferred into the data path, components are disabled to isolate at least one stage of the plurality of stages such that data written to or read from the at least one stage is available at an output. The data path is then calibrated to ensure proper communication between the memory controller and the memory device.

Another method for checking a data path for a semiconductor memory device, in accordance with the present invention, includes providing a semiconductor memory device including a plurality of stages in a data path, transferring data into the data path, maintaining the data on the plurality of stages, retrieving the data in the data path by disabling components at each stage to isolate each stage from the other stages to make the data available at an output and comparing the data at the output to expected data.

A method for testing a data path for a semiconductor memory device, in accordance with the present invention, includes the steps of providing a semiconductor memory device including a plurality of stages in a data path, transferring data into the data path, maintaining the data on the plurality of stages, and retrieving the data in the data path by disabling components at each stage to isolate each stage from the other stages to make the data available at an output. The step of retrieving includes the steps of disabling multiplexers to isolate a spine read write driver bus (SRWD) stage in the data path, retrieving the data at the SRWD stage, disabling multiplexers to isolate a quadrand read write driver bus (QRWD) stage in the data path, retrieving the data at the QRWD stage, disabling a column switch in the data path and retrieving the data from the MDQ's. The step of comparing the data at the output of each stage to expected data for that stage is also included.

In other methods one stage may include SRWD's and the step of disabling components may include the step of disabling multiplexers to isolate the one stage. One stage may include QRWD's and the step of disabling components may include the step of disabling multiplexers to isolate the one stage. One stage may include MDQ's and the step of disabling components may include the step of disabling a column switch to isolate an MDQ from a bitline. The at least one stage may include bitlines and the step of disabling components to isolate at least one stage may include the step of disabling a wordline to isolate a bitline. A calibration protocol may be provided which includes dynamically calibrating the data path. This protocol may provide communication between devices while running an application.

In still other methods, the data path may include sense amplifiers and the step of reading data directly from the sense amplifiers to test the data path may be included. The output may include a data line (DQ) pin. The method may include the step of calibrating the data path to set up for communications with other devices. The calibration may be performed by dynamically while running an application. The output may include a latch circuit. The output may be retrieved from a capacitive load. The data path may include sense amplifiers and the step of reading data directly from the sense amplifiers to test the data path may be included. One stage of the plurality of stages may include bitlines and the method may include the steps of disabling a wordline to isolate a bitline (and a memory cell).

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor memory testing, and more particularly to semiconductor memory testing. Disclosed is a data path diagnostic test mode for high-band width memories and memory to memory controller communication. In a write mode, data are written and held with at least one data bus, (read write driver) RWD, master data line (MDQ), bitline, etc. by isolating these stages from the memory array. In a read mode, data are read from at least one data bus, RWD, MDQ, bitline, etc. without reading the data from memory cells of a memory array. This verifies the data path, and provides verification of the memory to controller communication while isolating and protecting the memory array. The present invention will be described in terms of an 8 bit prefetch architecture as described in commonly assigned copending application No. 09/333,539, now U.S. Pat. No. 6,081,479 entitled "HIERARCHICAL PREFETCH FOR SEMICONDUCTOR MEMORIES", incorporated herein by reference. The present invention is not limited to the illustrative example and other architectures, for example including pipelines and prefetch methods, may be employed in accordance with the present invention.

Figure 1:
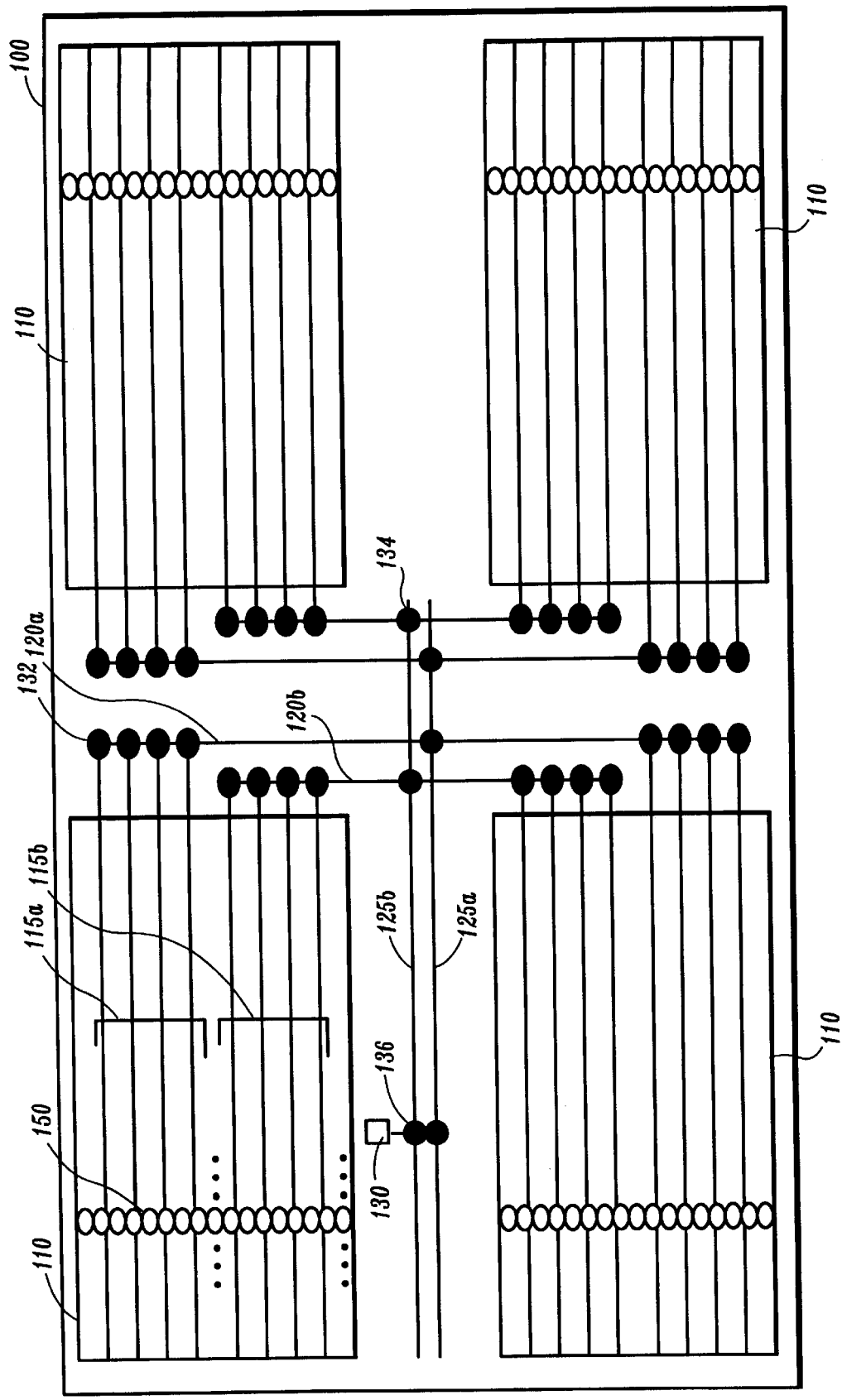
FIG. 1 is a schematic diagram showing a layout of a hierarchical semiconductor memory device for employing the present invention.

Referring now in specific detail to the drawings in which like reference numerals identify similar or identical elements throughout the several views, and initially to FIG. 1, the present invention will be illustratively described in terms of a hierarchical 4×2 bit prefetch with a three-stage clocked-pipeline; however the present invention may be employed for any data-path design which includes at least one data bus to confirm a successful read and write operation up to the data bus (e.g., DQ).

Figure 7:
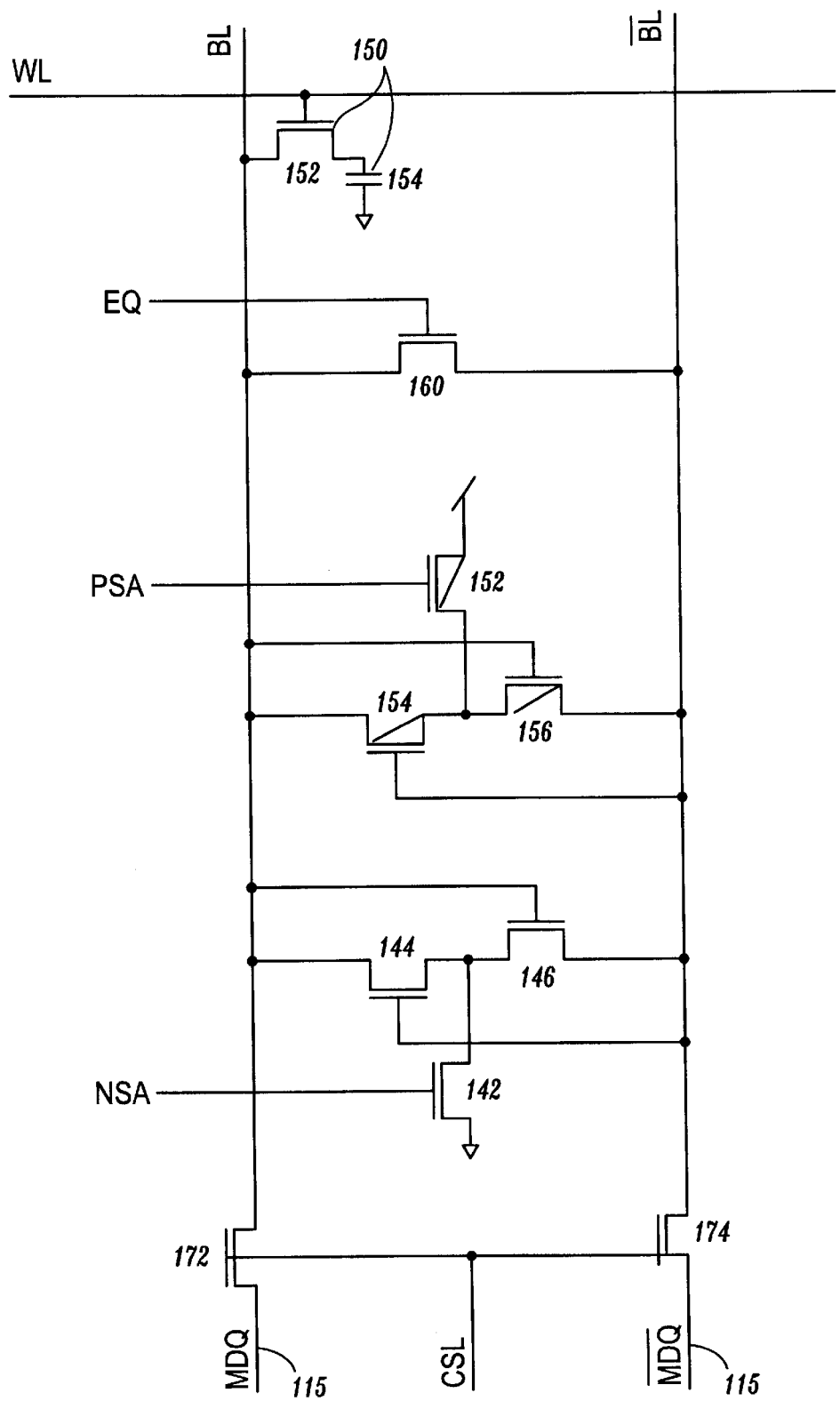
FIG. 7 is a schematic diagram showing the retrieval of data form bitlines or sense amplifiers in accordance with the present invention.

As shown in FIG. 1, a memory chip 100 includes four quadrants 110. Memory chip 100 may include dynamic random access memories (DRAMs) for example, SinkLink DRAMs (SLDRAMs), and Rambus DRAMs (RDRAMs) or other memory devices such as, application specific integrated circuits or embedded DRAMs. Each quadrant 110 includes a plurality of memory cells 150. A more detailed representation of memory cells 150 is shown in FIG. 7. Each quadrant 110 includes two groups of four data buses or MDQs (master data lines) 115a and 115b per data bit. MDQs 115a and 115b are employed for reading or writing consecutive eight burst bits from accessed 8 bit memory cells 150. For simplicity, FIG. 1 shows a data path for a single data pin or DQ 130. It is to be understood that the present invention is not limited to this configuration. Each of four MDQs 115a and 115b in quadrant 110 are supported by a corresponding second data bus or QRWD's (quadrand read write drive bus) 120a and 120b with 1:4 multiplexers (MUX) 132. Second sense amplifiers may be used for this multiplexing, which is known in the art.

Two QRWDs 120a and 120b in each quadrant 110 are coupled to two third data buses, for example, spine read write drive bus (SRWDs) 125a and 125b. The two SRWDs 125a and 125b share one DQ pin 130. In summary, the pairs of four MDQs 115a and 115b are coupled to the corresponding QRWDs 120a and 120b by multiplexing 1:4 multiplexers (MUXs) 132 (e.g., second sense amplifiers). Two QRWDs 120a and 120b are coupled to SRWDs 125a and 125b by second (1:2) multiplexers 134. Two SRWDs 125a and 125b, which are coupled to a single data line (DQ) 130 through 1:2 third multiplexers (MUXs) 136.

In a read mode, consecutive 8 burst bits are simultaneously read out from the memory cells 150 to two groups of 4 MDQs 115a and 115b as a hierarchical 4×2 (=8) bit prefetch. Eight (e.g., 4×2) data bits on two 4 MDQ groups 115a and 115b are multiplexed to the corresponding two QRWD's 120a and 120b, wherein 4×2 bit prefetch on 2 QRWD's 120a and 120b per DQ pin 130 is converted to a 2 bit prefetch per DQ pin 130. The consecutive 2 burst bits on QRWD's 120a and 120b are simultaneously transferred to two SRWD's 130a and 130b. Finally, they are converted to 2 serial burst bits for the DQ pin 130.

In a write mode, two consecutive burst bits given by the DQ pin 130 are written to two SRWD's 125a and 125b, and two QRWD's 120a and 120b in the corresponding quadrant 110. The 4×2 (=8) consecutive burst bits on two QRWD's 120a and 120b are written to the corresponding two groups of four MDQs 115a and 115b. They are written to the corresponding 8 bit cells, accordingly. It is to be understood that the data rate is preferably reduced for data transfer through each stage to avoid bottlenecks. For example, 4×2 prefetch transfers 4×2 (8) bits to latches (which may be included in the multiplexers). The latches temporarily store the 4×2 bits and transfer 4×2 bits sequentially at ⅛ the transfer rate of DQ 130. This maintains an overall data rate for all stages of the architecture in the write mode. The opposite is true for read mode.

Having described an illustrative hierarchical 4×2 bit prefetch architecture, data path diagnostic test modes are now described in greater detail.

Figure 2:
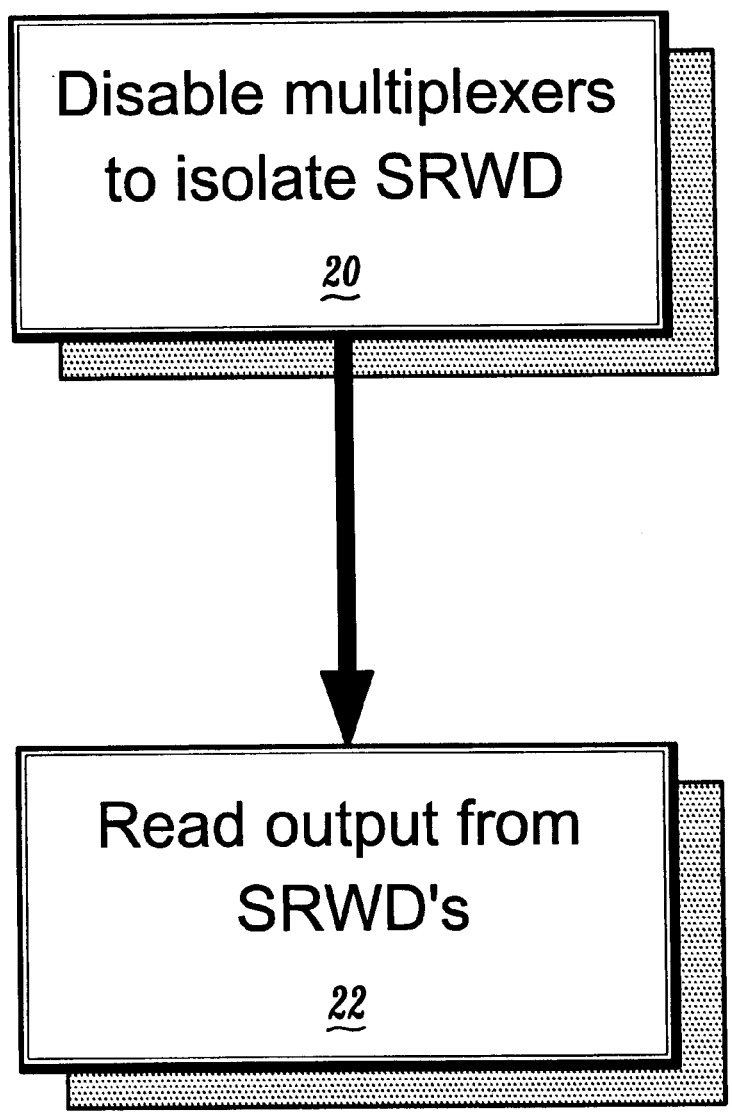
FIG. 2 is a flow diagram testing an SRWD stage in accordance with the present invention.

Referring to FIG. 2 with continued reference to FIG. 1, an SRWD Write/Read test mode is illustratively shown. In block 20, multiplexers 134 are disabled, for example, by applying logic signals or switches, which disable the MUX 134. This permits the data bits to be written up to SRWD's 125a and 125b, which are read from the DQ pin 130, in block 22. Two bit burst mode is preferably used, although other modes may be employed. Two bit burst mode is where 2 serial bits of DQs are written or read to two parallel SRWDs 125a, 125b. The SRWDs 125a and 152b may hold data by either a capacitive load or a latch circuit coupled to each SRWDs 125a and 125b, which are illustratively shown in FIG. 3.

Figure 3:
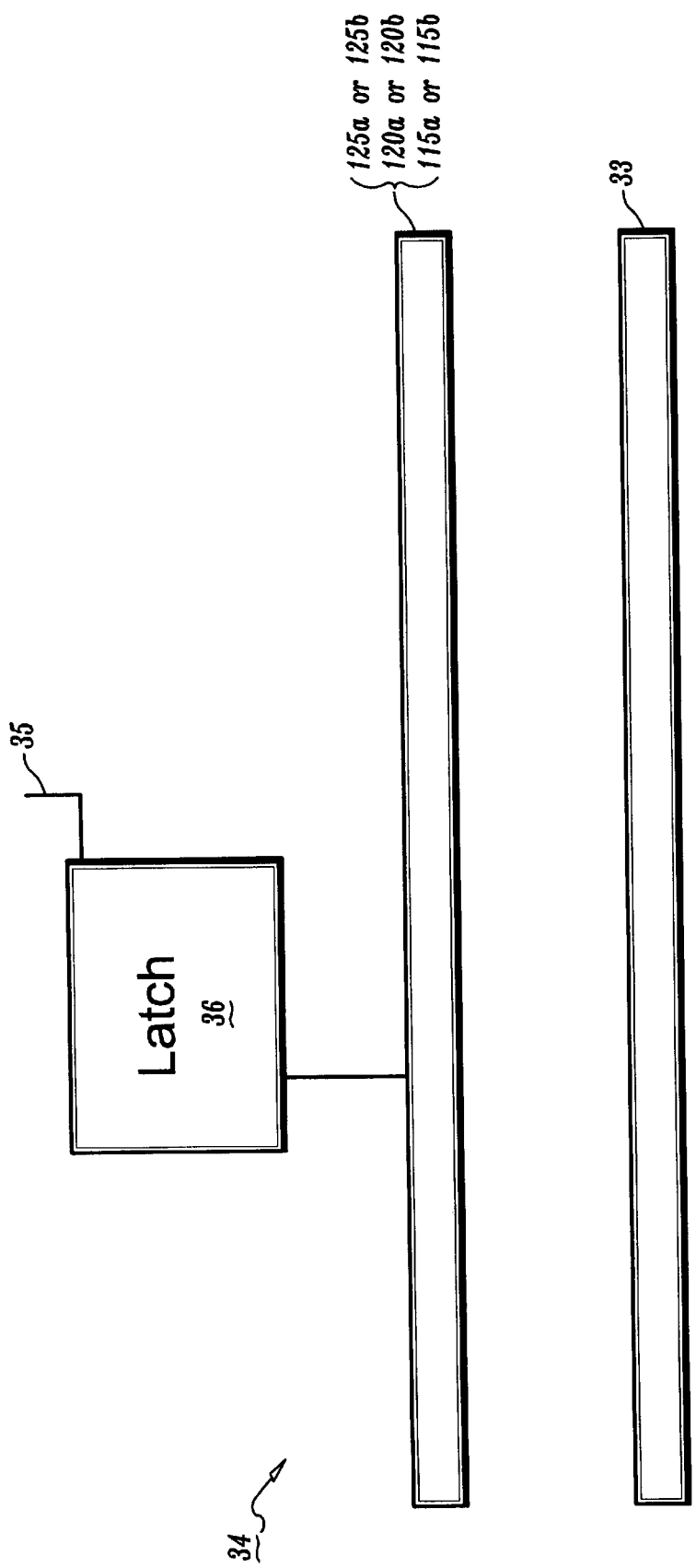
FIG. 3 is a schematic diagram showing structures for retrieving data from isolated stages in a data path in accordance with the present invention.

FIG. 3 shows a capacitive structure 34 which may include a metal line or diffusion region 33 (for capacitive coupling to from SRWD's 125a or 125b, QRWD's 120a and 120b or to MDQs 115a and 115b) which is coupled to an output 35, for example DQ 130. Alternately, a latch 36 is employed for temporary storage of data. Latch 36 is coupled to an output 35, for, example, pin 130 or other output for providing information from SRWD's 125a or 125b, QRWD's 120a and 120b or to MDQs 115a and 115b (see below). Latch 36 may be eliminated if the wiring capacitance of the RWDs is sufficiently large.

Figure 4:
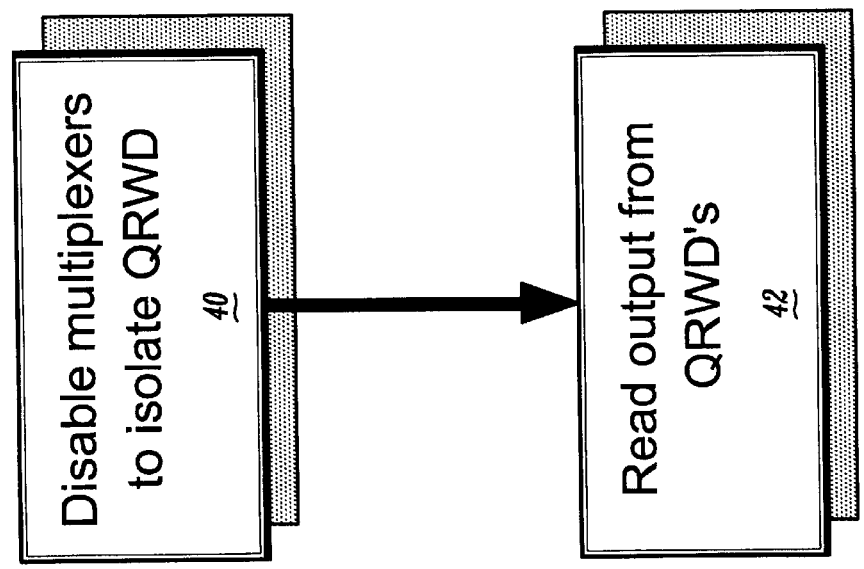
FIG. 4 is a flow diagram for testing a QRWD stage in accordance with the present invention.

Referring to FIG. 4 with continued reference to FIG. 1, a QRWD Write/Read test mode is illustratively shown. Multiplexers 132 (FIG. 1) are disabled in block 40, for example, by applying logic signals or switches which disable the MUX 132. This permits the data bits to be written up to QRWD's 120a and 120b, which are then read from the DQ pin 130 in block 42 through SRWDs 125a and 125b. 2 bit burst mode is preferably used although other modes may also be employed. The QRWD's 120a and 120b may hold data by either capacitive load or a latch circuit coupled to each QRWD's 120a and 120b as shown in FIG. 3.

Figure 5:
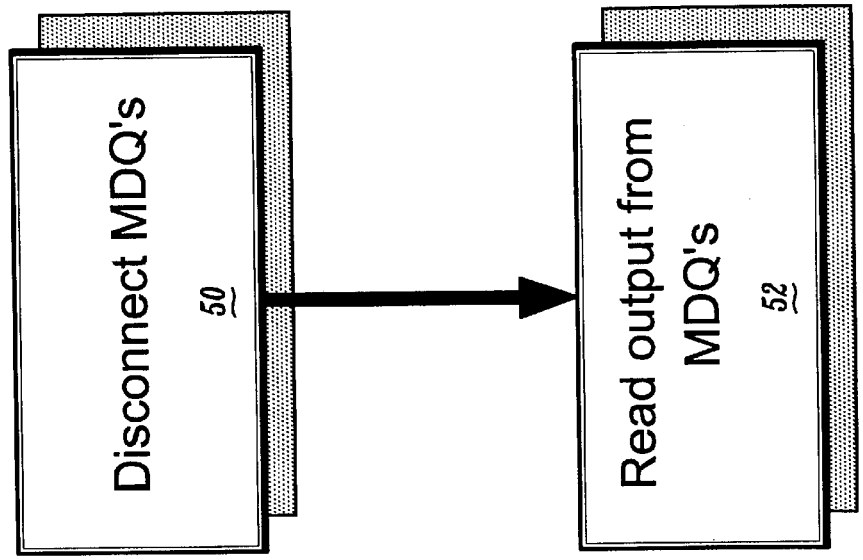
FIG. 5 is a flow diagram testing an MDQ stage in accordance with the present invention.

Referring to FIG. 5, an MDQ Write/Read test mode is illustratively shown. A column switch, or MDQ switch, which enables a connection MDQ's 115a or 115b is disabled (e.g., open switch) in block 50. Column switches are known in the art and couple the MDQ to the memory array. This permits the data bits to be written up to MDQ's 115a and 115b, which are then read from the DQ pin 130 through QRWDs 120a and 120b and SRWDs 125a and 125b. 8 bit burst mode is preferably employed although other modes are also contemplated. The MDQ's 115a and 115b can hold data by either capacitive load or a latch circuit coupling to each MDQ's 115a and 115b, as described with reference to FIG. 3.

Figure 6:
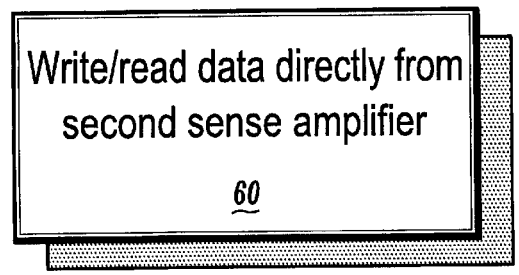
FIG. 6 is a flow diagram for testing an SRWD stage in accordance with the present invention.

Referring to FIG. 6, sense amplifiers (or MUX's) 132 (FIG. 1) may be employed to write/read data in an illustrative test mode. MUXs 132 include sense amplifiers, known in the art as second sense amplifiers. The data can be written to the second sense amplifier in block 60. The data can be read directly from second sense amplifier in MUX 132.

Referring to FIG. 7, the data bus diagnostic test mode of the present invention may further include a bitline test mode employing bitlines and sense amplifier which are isolated to retrieve data to calibrate or check the data path. FIG. 7 shows an illustrative schematic of a memory array including a plurality of cells 150 (see also FIG. 1). Although this example shows the DRAM array configuration having a plurality of DRAM cells 150, the invention can be applied for any type of memory such as Static Random Access Memory (SRAM), Non-Volatile Random Access Memory (NVRAM), etc. Each memory cell 150 includes an access device 152 and a capacitor 154 as is known in the art for DRAMs.

In a read or write operation from memory cells 150, the signal EQ falls, disabling a bitline equalizer 160. The bitline pairs (BL and BL bar) are turned off. A wordline (WL) then rises, coupling the capacitance to the bitline (BL). The BL voltage after coupling the capacitor 154 is determined by the charge stored in the capacitor 154. This generates a small voltage difference between the BL and the complement BL (BL bar). The signals NSA and PSA go high and low, respectively. The small voltage difference is thus amplified by (e.g., CMOS cross-coupled) sense amplifiers 144, 146, 154 and 156 by making drivers 142 and 144 turn on. The MDQ pairs 115 are coupled to the bitline pairs (BL) through a column switch 172 and 174. This allows the amplified data to be read or written from the MDQ pair 115. Additional switches (e.g., MDQ switches) may be included between BL to MDQs. The amplified BL voltage is restored to the memory cell 150.

In a data path diagnostic test mode of the present invention, the wordline WL is deactivated, while equalizer 160 is turned off, and sense amplifiers 144, 146, 154 and 156 are turned on, as in a normal mode. This permits data to be read or written to the sense amplifiers 144, 146, 154 and 156 or bitlines BL by activating column switches 172 and 174 as an SRAM with a sense amplifier. Because the wordline WL is not activated, the memory cell 150 data can be maintained. Optionally, sense amplifiers 144, 146, 154 and 156 may be disabled if the BL capacitance is sufficiently large to maintain the data thereon.

It is to be understood that the steps shown in each of FIGS. 2, 4, 5, 6 and 7 may be employed separately or in any combination thereof. For example, a single test may be run which includes moving data through each stage (e.g., BL, MDQ, second sense amplifier, SRWD, and QRWD stages) with a cycle between each stage for disabling the components as described above and reading out the data at each stage. For example, in a first cycle, data is transferred from memory cells 150 to bitlines (BL) and then in a second cycle data on BLs are transferred to MDQ's 115, the column switch disconnects MDQ's from the memory array in a third cycle, data is read from MDQ in a fourth cycle as described above with MDQ's disabled and finally the data is passed on to the next stage, e.g., second sense amplifier (MUX 132). This illustrative procedure may be continued for the other stages as well to provide a complete data path test to ensure proper operation of a data path.

Advantageously, the present invention provides a test mode, which isolates the memory array from the test process. Isolating the memory cells is particularly advantageous for verifying memory to memory controller communication at a system level. As the memory frequency increases, there is a need to calibrate the data communication periodically or dynamically (e.g., in real-time) between chips, while maintaining and protecting the memory data for the application. This diagnostic test mode enables writing and reading data without using the memory cell, which is an ideal solution to give a means to verify the communication. The memory or system verification is easily provided in accordance with the invention as will be described in greater detail with reference to FIG. 9.

Figure 8:
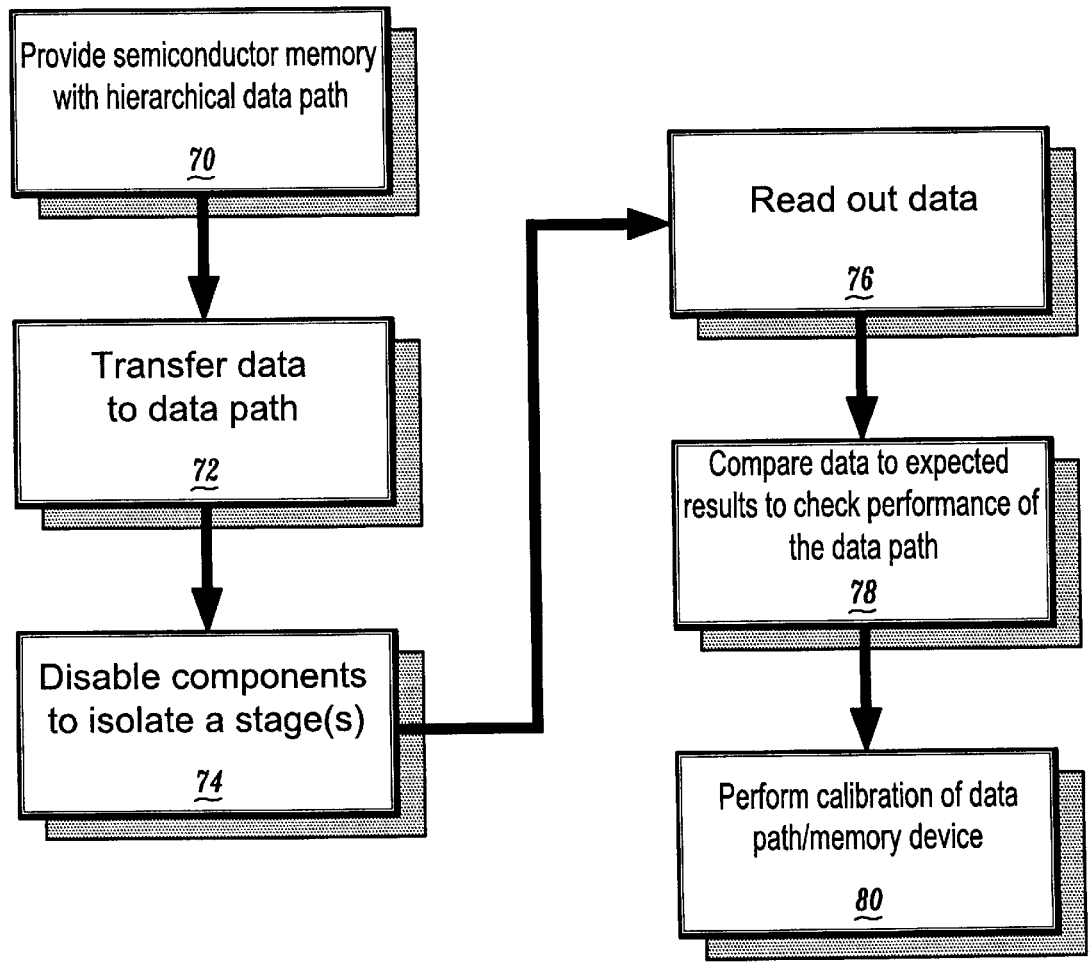
FIG. 8 is a flow diagram for testing or calibrating a data path in accordance with the present invention.

Referring to FIG. 8, in block 70, a semiconductor memory device is provided having a hierarchical data path. The hierarchical data path includes a plurality of stages, for example, 3 or 4 stages as employed in the illustrative examples above (FIG. 1 and FIG. 7). In block 72, data is written into a DQ or read from memory cells to transfer data into the hierarchical architecture. In block 74, components needed to transfer the data are disabled to isolate a given stage(s). This is preferably performed as described with reference to FIGS. 2, 4, 5, 6 and 7 above. Advantageously, this step isolates the memory array during testing. In block 76, data is read out from DQs or outputs provided for reading out data as described with reference to FIG. 3. For example, MUXs 132 may provide an output (e.g., a metal line) to read data directly therefrom. In block 78, data read from the isolated components is compared to expected data to measure performance of the data path at each stage. This may include comparing electrical characteristics and cycle times. Optionally, in block 80, read data from block 76 may be employed for calibration of the memory device using a memory controller or other device as explained below with the reference to FIG. 9. This is advantageously performed without destroying data in the memory array.

Figure 9:
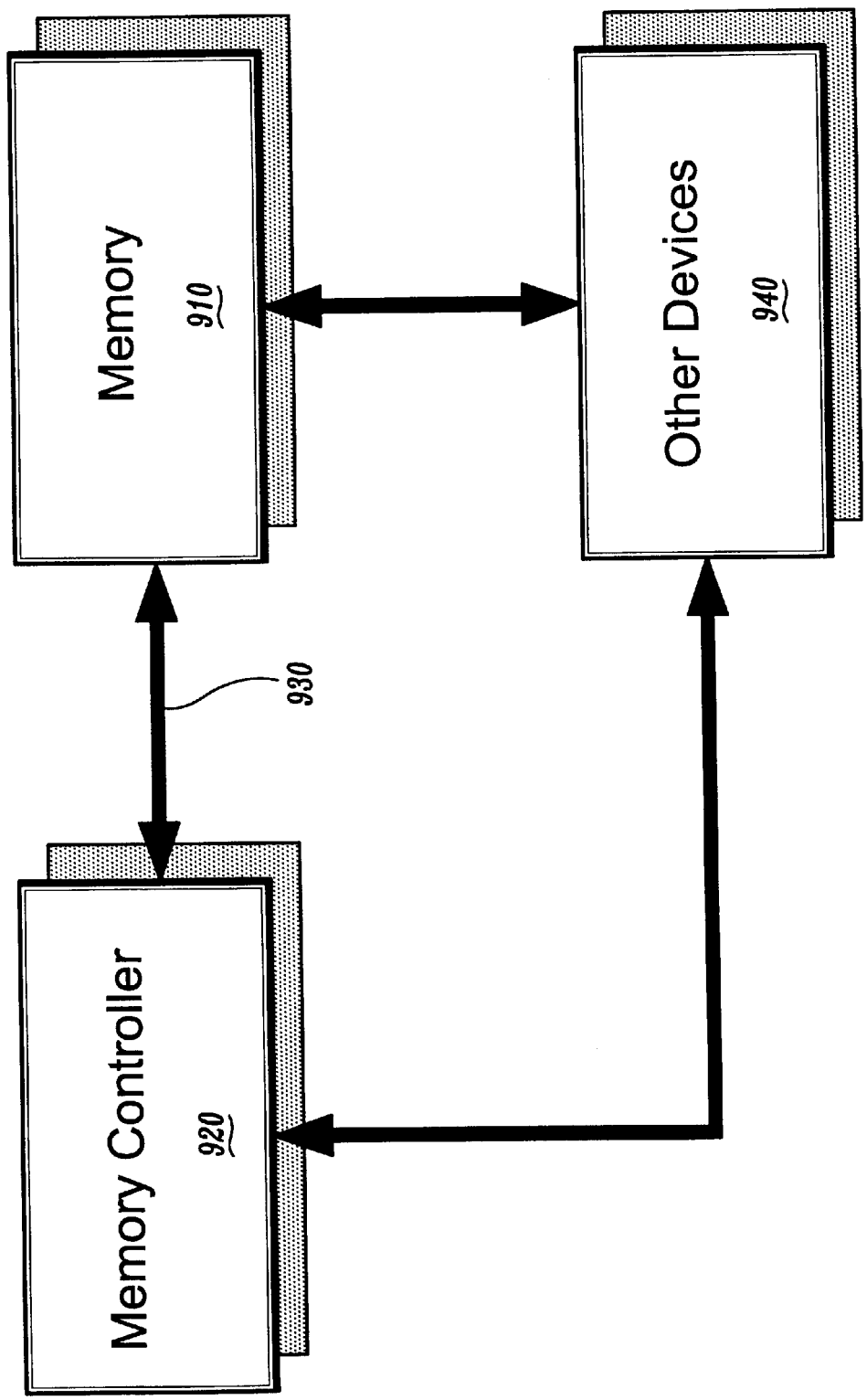
FIG. 9 is a block/flow diagram showing memory controller communication with a memory device in accordance with the invention.

Referring to FIG. 9, a data communication verification method and system are shown in accordance with the present invention. At a system level, a memory device 910 is included, which may be a DRAM or other memory device. A memory controller 920, which are known in the art is also included. Memory controller 920 enables a data read or write as in a conventional memory protocol. Memory controller 920 also provides memory control functions for memory 910 as is known in the art. In accordance with the present invention, memory 910 isolates the memory array at the corresponding stage discussed previously, permitting write or read functions without destroying memory cell data. For example, the memory 910 disables the WL activation while activating sense amplifiers. This permits the data to be read or written to the sense amplifiers as discussed with reference to FIG. 7, while keeping the memory cell data in tact.

The isolation of the memory array permits memory controller 920 to check, verify or calibrate the capabilities of the data path of memory 910. This is performed, for example, by comparing the input data to output data and performing a notification operation if incompatibilities exist. By employing the present invention, diagnostic procedures can advantageously be performed at a level of the data path.

Either memory controller 920 or memory 910 can calibrate the data timing so that they can successfully communicate the data on a system data bus 930. This may be performed in real-time. In other words, by periodically or dynamically calibrating the data path, correct, synchronous and accurate communications may be made by compensating for any mismatches in timing between chips 910 and 920. Such mismatches may come from wiring delays, temperature effects or other effects. The present invention further contemplates that this calibration scheme may be employed with any devices 940 needing to communicate within given timing parameters. The calibration process may be performed by employing a communication protocol between chips. Chip protocols are known in the art. The protocol of the present invention provides for a calibration process to compare data in to data out as described above. Advantageously, in accordance with the invention, this process may be performed while the memory chip is running an application, such as a software application for the system, which the memory chip serves. In other words, calibrating the data path to set up for communications with other devices may include calibrating the data path during normal operation of the data path. The system level calibration between devices may be performed to ensure proper communication between devices without destroying data in a memory array and making a dynamic data skew calibration possibly while running an application.

Having described preferred embodiments for data path diagnostic test and calibration mode with data bus for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for checking a data path for a semiconductor memory device, comprising the steps of:

providing a semiconductor memory device including a plurality of stages in a data path;

transferring data into the data path;

isolating at least one stage of the plurality of stages such that data written to or read from the at least one stage is available at an output; and calibrating the data path to set up for communications with other devices.

2. The method as recited in claim 1, further comprising the step of comparing the data at the output to expected data.

3. The method as recited in claim 1, wherein the at least one stage includes spine read write driver buses (SRWD's) and the step of isolating at least one stage includes the step of disabling multiplexers to isolate the at least one stage.

4. The method as recited in claim 1, wherein the at least one stage includes quadrand read write driver buses (QRWD's) and the step of isolating at least one stage includes the step of disabling multiplexers to isolate the at least one stage.

5. The method as recited in claim 1, wherein the at least one stage includes master data lines (MDQ's) and the step of isolating at least one stage includes the step of disabling a column switch coupled to the MDQ's to isolate the at least one stage.

6. The method as recited in claim 1, wherein the at least one stage includes bitlines and the step of isolating at least one stage includes the step of disabling a wordline to isolate a bitline in the memory device.

7. The method as recited in claim 1, wherein the data path includes sense amplifiers and further comprises the step of reading data directly from the sense amplifiers to test the data path.

8. The method as recited in claim 1, wherein the output includes a data pin (DQ).

9. The method as recited in claim 1, wherein the output includes a latch circuit.

10. The method as recited in claim 1, wherein the output is retrieved from a capacitive load.

11. The method as recited in claim 1, wherein the step of calibrating the data path to set up for communications with other devices includes the step of dynamically calibrating the data path while running an application.

12. A method for checking a data path for a semiconductor memory device, comprising the steps of:

providing a semiconductor memory device including a plurality of stages in a data path;

transferring data into the data path;

maintaining the data on the plurality of stages;

retrieving the data in the data path by disabling components at each stage to isolate each stage to make the data available to an output;

comparing the data at the output to expected data; and calibrating the data path to set up for communications with other devices.

13. The method as recited in claim 12, wherein one stage includes spine read write driver buses (SRWD's) and the step of disabling components includes the step of disabling multiplexers to isolate the one stage.

14. The method as recited in claim 12, one stage includes quadrand read write driver buses (QRWD's) and the step of disabling components includes the step of disabling multiplexers to isolate the one stage.

15. The method as recited in claim 12, wherein one stage includes master date lines (MDQ's) and the step of disabling components includes the step of disabling a column switch coupled to the MDQ's to isolate the one stage.

16. The method as recited in claim 12, wherein the at least one stage includes bitlines and the step of disabling components to isolate at least one stage includes the step of disabling a wordline to isolate a bitline in the memory device.

17. The method as recited in claim 12, wherein the data path includes sense amplifiers and further comprises the step of reading data directly from the sense amplifiers to test the data path.

18. The method as recited in claim 12, wherein the output includes a data pin (DQ).

19. The method as recited in claim 12, wherein the step of calibrating the data path to set up for communications with other devices includes the step of dynamically calibrating the data path while running an application.

20. The method as recited in claim 12, wherein the output includes a latch circuit.

21. The method as recited in claim 12, wherein the output is retrieved from a capacitive load.

22. A method for testing a data path for a semiconductor memory device, comprising the steps of:
   providing a semiconductor memory device including a plurality of stages in a data path;
   transferring data into the data path;
   maintaining the data on the plurality of stages;
   retrieving the data in the data path by disability components at each stage to isolate each stage from the other stages to make the data available at an output which includes the steps of:
      disabling multiplexers to isolate a spine read write driver bus (SRWD) stage in the data path;
      retrieving the data at the SRWD stage;
      disabling multiplexers to isolate a quadrand read write driver bus (QRWD) stage in the data path;
      retrieving the data at the QRWD stage;
      disabling a column switch to isolate MDQ's in the data path; and
      retrieving the data at from the MDQ's; and
      comparing the data at the output of each stage to expected data for that stage.

23. The method as recited in claim 22, wherein the data path includes sense amplifiers and further comprises the step of reading data directly from the sense amplifiers to test the data path.

24. The method as recited in claim 22, wherein one stage of the plurality of stages includes bitlines and the method further comprises the steps of:
   disabling a wordline to isolate a bitline; and
   retrieving data from the bitline.

25. The method as recited in claim 22, wherein the output includes a data pin (DQ).

26. The method as recited in claim 22, wherein the output includes a latch circuit.

27. The method as recited in claim 22, wherein the output is retrieved from a capacitive load.

28. A method for calibrating a data patch for a memory device, comprising the steps of:
   providing a semiconductor memory device including a plurality of stages in a data path;
   providing a memory controller for controlling memory operations of the memory device;
   transferring data into the data path;
   isolating at least one stage of the plurality of stages such that data written to or read from the at least one stage is available at an output; and
   calibrating the data path to ensure proper communication between the memory controller and the memory device.

29. The method as recited in claim 28, wherein the step of calibrating the data path includes the step of dynamically calibrating the data path while running an application.

30. The method as recited in claim 28, further comprising the step of comparing the data at the output to expected data.

31. The method as recited in claim 28, wherein the at least one stage includes spine read write driver buses (SRWD's) and the step of isolating at least one stage includes the step of disabling multiplexers to isolate the at least one stage.

32. The method as recited in claim 28, wherein the at least one stage includes quadrand read write driver buses (QRWD's) and the step of isolating at least one stage includes the step of disabling multiplexers to isolate the at least one stage.

33. The method as recited in claim 28, wherein the at least one stage includes master data lines (MDQ's) and the step of isolating at least one stage includes the step of disabling a column switch coupled to the MDQ's to isolate the at least one stage.

34. The method as recited in claim 28, wherein the at least one stage includes bitlines and the step of isolating at least one stage includes the step of disabling a wordline to isolate a bitline.

35. The method as recited in claim 30, wherein the data path includes sense amplifiers and further comprises the step of reading data directly from the sense amplifiers to test the data path.

36. The method as recited in claim 28, wherein the output includes a data pin (DQ).

37. The method as recited in claim 28, wherein the output includes a latch circuit.

38. The method as recited in claim 28, wherein the output is retrieved from a capacitive load.

39. The method as recited in claim 28, further comprising the step of calibrating the data path to set up for communications with other devices.

40. A method for checking a data path for a semiconductor memory device, comprising the steps of:
   providing a semiconductor memory device including a plurality of stages in a data path;
   transferring data into the data path; and
   isolating at least one stage of the plurality of stages such that data written to or read from the at least one stage is available at an output, wherein the isolation of least one stage includes one of the steps of:
      disabling multiplexers to isolate a spine read write driver bus (SRWD) stage in the data path, disabling multiplexers to isolate a quadrand read write driver bus (QRWD) stage in the data path, or disabling a column switch to isolate MDQ's in the data path.

* * * * *